(12) United States Patent
Ito (10) Patent No.: US 7,358,027 B2
(45) Date of Patent: Apr. 15, 2008

(54) COPOLYMER FOR USE IN CHEMICAL AMPLIFICATION RESISTS

(75) Inventor: Hiroshi Ito, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1021 days.

(21) Appl. No.: 10/091,373

(22) Filed: Mar. 4, 2002

(65) Prior Publication Data

US 2003/0186160 A1  Oct. 2, 2003

(51) Int. Cl.
G03F 7/00 (2006.01)
G03F 7/004 (2006.01)

(52) U.S. Cl. .................... 430/270.1; 430/325; 430/907

(58) Field of Classification Search ............. 430/270.1, 430/325, 907
See application file for complete search history.

(56) References Cited

U.S. PATENT DOCUMENTS

| | | | |
|---|---|---|---|
| 5,344,742 A | 9/1994 | Sinta et al. | |
| 6,087,064 A | 7/2000 | Lin et al. | |
| 6,329,125 B2* | 12/2001 | Takechi et al. | 430/326 |
| 6,548,219 B2* | 4/2003 | Ito et al. | 430/270.1 |
| 6,835,524 B2* | 12/2004 | Hatakeyama et al. | 430/270.1 |
| 6,908,724 B2* | 6/2005 | Araki et al. | 430/270.1 |
| 2002/0058199 A1* | 5/2002 | Zampini et al. | 430/270.1 |
| 2002/0102490 A1 | 8/2002 | Ito et al. | |

FOREIGN PATENT DOCUMENTS

| | | |
|---|---|---|
| JP | 60042411 A * | 3/1985 |
| JP | 2000-102799 | 4/2000 |
| JP | 2000-177494 | 6/2000 |
| JP | 2001-061896 | 3/2001 |
| JP | 2001-154362 | 6/2001 |
| JP | 2003-040926 | 2/2003 |
| JP | 2003-212915 | 7/2003 |
| WO | WO 01/74916 | 10/2001 |
| WO | WO 01/74916 A1 * | 10/2001 |
| WO | WO 02/21216 A2 * | 3/2002 |
| WO | WO 02/069038 | 9/2002 |

OTHER PUBLICATIONS

English language abstract of Klimova et al ;Zhurnal Prikladnoi Khimii, 1965.*

(Continued)

*Primary Examiner*—Amanda C. Walke
(74) *Attorney, Agent, or Firm*—Isaac M. Rutenburg; Dianne E. Reed; Mintz, Levin, Cohn, Ferris, Glovsky and Popeo, PC (57) ABSTRACT

A copolymer is provided for use in a lithographic photoresist composition, particularly a chemical amplification photoresist. In a preferred embodiment, the copolymer is substantially transparent to deep ultraviolet radiation, i.e., radiation of a wavelength less than 250 nm, including 157 nm, 193 nm and 248 nm radiation, and has improved sensitivity and resolution. In one embodiment, the copolymer is comprised of an α-cyano- or an α-trifluoro-methacrylate monomer unit and a vinyl ether monomer unit. A lithographic photoresist composition containing the fluorinated copolymer is also provided, as is a process for using the composition to generate resist images on a substrate, i.e., in the manufacture of integrated circuits or the like.

31 Claims, 1 Drawing Sheet

OTHER PUBLICATIONS

English language abstract of Toshio et al JP 60-42411.*
U.S. Appl. No. 09/771,149, filed Jan. 26, 2001, Ito et al.
U.S. Appl. No. 09/771,261, filed Jan. 26, 2001, Brock et al.
U.S. Appl. No. 09/794,466, filed Feb. 26, 2001, Allen et al.
Abe et al. (1995), "Study of ArF Resist Material in Terms of Transparency and Dry Etch Resistance," *Journal of Photopolymer Science and Technology 8*(4):637-642.
Allen et al. (1995), "Resolution and Etch Resistance of a Family of 193 nm Positive Resists," *Journal of Photopolymer Science and Technology 8*(4):623-636.
Endert et al. (1999), "Microstructuring with 157 nm Laser Light," *Proceedings of SPIE—The International Society for Optical Engineering 3618*:413-417.
Onishi et al. (1991), "Acid Catalyzed Resist for KrF Excimer Laser Lithography," *Journal of Photopolymer Science and Technology 4*(3):337-340.
Chiba et al. (2000), "157 nm Resist Materials: A Progress Report," *Journal of Photopolymer Science and Technology 13*(4):657-664.
Choi et al. (2000), "Design and Synthesis of New Photoresist Materials for ArF Lithography," *Advances in Resist Technology and Processing XVII, Proceeding of SPIE 3999*:54-61.
Ito et al. (1981), "Methyl α-Trifluoromethylacrylate, an E-Beam and UV Resist," *IBM Technical Disclosure Bulletin 24*(2):991.
Ito et al. (1982), "Polymerization of Methyul α-(Trifluoromethyl)acrylate and α-(Trifluoromethyl)Acrylonitrile and Copolymerization of These Monomers with Methyl Methacrylate," *Macromolecules 15*(3):915-920.
Ito (1984), "Radical Reactivity and Q-e Values of Methyl α-(Trifluoromethyl)acrylate," *Macromolecules 17*(10):2204-2205.
Ito et al. (1987), "Anionic Polymerization of α-(Trifluoromethyl)acrylate," *Recent Advances in Anionic Polymerization, Elsevier*, pp. 421-430.
Ito et al. (2001), "Novel Fluoropolymers for Use in 157 nm Lithography," *Journal of Photopolymer Science and Technology 14*(4):583-593.
Ito et al. (2001), "Polymer Design for 157 nm Chmically Amplified Resists," *Advances in Resist Technology and Processing XVIII, Proceedings of SPIE 4345*:273-284.
Kunz et al. (1999),"Outlook for 157 nm Resist Design," *Proceedings of SPIE 3678*:13-23.
Schmidt et al. (1962), "Ozonisierung Cyclischer Enolather," *Liebigs Ann. Chem. Bd. 656*:97-102.
Willson et al. (1983), "Poly(Methyl α-Trifluoromethylacrylate) as a Positive Electron Beam Resist," *Polymer Engineering and Science 23*(18):1000-1003.

* cited by examiner

COPOLYMER FOR USE IN CHEMICAL AMPLIFICATION RESISTS

TECHNICAL FIELD

This invention relates generally to the fields of lithography and semiconductor fabrication. More particularly, the invention relates to the use of certain polymers useful in chemical amplification photoresist compositions, including ultraviolet, electron-beam, and x-ray photoresists.

BACKGROUND

There is an ongoing need in the electronics industry for increasingly higher circuit densities in microelectronic devices made using lithographic techniques. One method of increasing the number of components per integrated circuit ("chip") is to decrease the minimum feature size on the chip, which requires higher lithographic resolution. This decrease in feature size has been accomplished over the past twenty years by reducing the wavelength of the imaging radiation from the visible (436 nm) down through the ultraviolet (365 nm) to the deep ultraviolet (DUV; 248 nm). Development of commercial lithographic processes using ultra-deep ultraviolet radiation, particularly at 193 nm or 157 nm, is now of increasing interest. See, for example, Allen et al. (1995), "Resolution and Etch Resistance of a Family of 193 nm Positive Resists," *J. Photopolym. Sci. and Tech*. 8(4):623-636, and Abe et al. (1995), "Study of ArF Resist Material in Terms of Transparency and Dry Etch Resistance," *J. Photopolym. Sci. and Tech*. 8(4):637-642.

Attempts have been made to develop 157 nm resists, for example, by using heavily fluorinated materials such as polytetrafluoroethylene (e.g., Teflon AF®; see Endert et al. (1999) *Proc. SPIE-Int. Soc. Opt. Eng*, 3618:413-417) or hydridosilsesquioxanes (see U.S. Pat. No. 6,087,064 to Lin et al.). These materials do not, however, have the requisite reactivity or solubility characteristics. The challenge in developing chemically amplified resists for 157 nm lithography lies in achieving suitable transparency in polymers that have acid-labile functionalities using industry standard developers in either exposed or unexposed areas, depending on whether the resist is positive or negative.

Homo- and copolymers of methyl α-trifluoromethylacrylate (MTFMA) and its derivatives have been found to be surprisingly transparent at 157 nm, with an optical density (OD) of less than 3/μm, whereas poly(methyl methacrylate) (PMMA) is highly absorbing, with an OD of 6/μm at 157 nm; see, for example, Ito et al. (2001), "Polymer Design for 157 nm Chemically Amplified Resists," *Proc. SPIE* 4345: 273-284; Ito et al. (2001), "Novel Fluoropolymers for Use in 157 nm Lithography," *J. Photopolym. Sci. Technol*. 14:583-593, and Chiba et al. (2000), "157 nm Resist Materials: a Progress Report," *J. Photopolym. Sci. Technol*. 13:657-664.

Unfortunately, MTFMA and its derivatives do not readily undergo radical homopolymerization, and polymers can be made only by anionic polymerization (see Ito et al. (1981), "Methyl α-Trifluoroacrylate, an E-Beam and UV Resist," IBM Technical Disclosure Bulletin 24(2): 991). Although MTFMA-methacrylate copolymers are highly useful as 157 nm resist polymers, it is still desirable to identify comonomers that polymerize with α-trifluoromethylacrylic monomers by radical initiation. Radical polymerization is easy to run and economical they are an ideal process for preparation of resist polymers.

It has recently been discovered that MTFMA, α-trifluoromethylacrylic acid (TFMAA), and other esters conveniently undergo radical copolymerization with various vinyl ether derivatives. As discussed in Choi et al. (2000) "Design and Synthesis of New Photoresist Materials for ArF Lithography," *Proc. SPIE* 3999:54-61, while vinyl ethers have been copolymerized with maleic anhydride (MA) for the design of 193 nm resists (VEMA), terpolymerization with a third functional monomer was required, because neither vinyl ether nor MA was functional. Also, the VEMA system has not proven useful for 157 nm lithography due to its excessive absorption.

SUMMARY OF THE INVENTION

As the α-trifluoromethylacrylic monomers are functional, copolymerization of these monomers with vinyl ethers and their derivatives provide resist copolymers that are highly suitable for use in 157 nm lithography.

Accordingly, it is a primary object of the invention to address the above-described need in the art by providing a novel copolymer that is suitable for use in lithographic photoresist compositions.

It is another object of the invention to provide a lithographic photoresist composition containing the novel copolymer.

It is still another object of the invention to provide a method for generating a resist image on a substrate using a photoresist composition as described herein.

It is a further object of the invention to provide a method for forming a patterned structure on a substrate by transferring the aforementioned resist image to the underlying substrate material, e.g., by etching.

Additional objects, advantages, and novel features of the invention will be set forth in part in the description which follows, and in part will become apparent to those skilled in the art upon examination of the following, or may be learned by practice of the invention.

In one aspect of the invention, then, a novel copolymer is provided that is prepared by copolymerization of a first monomer having the structure of formula (I)

wherein
  $R^1$ is H, F, CN, $CH_3$, or $C_{1-6}$ fluoroalkyl (with fluorinated methyl groups, i.e., $CF_2H$, $CFH_2$, and $CF_3$, being preferred $C_{1-6}$ fluoroalkyl substituents),
  $R^{2a}$ and $R^{2b}$ are independently H or F, and
  $R^3$ is CN or COOR, wherein R is selected from the group consisting of H, $C_{1-12}$ alkyl, and $C_{1-12}$ fluoroalkyl, or is selected so as to render $R^3$ acid-cleavable, with the proviso that when $R^3$ is CN, then $R^1$ is $CF_3$ and $R^2$ is H; and a second monomer having the structure of formula (II)

wherein
- $R^4$ is H, $C_{1-12}$ alkyl, $C_{3-15}$ alicyclic, or fluorinated $C_{3-15}$ alicyclic;
- $R^5$ is $C_{1-12}$ alkyl, $C_{1-12}$ alkyl substituted with 1-12 fluorine atoms and 0-2 hydroxyl groups, or $C_{3-15}$ alicyclic; or $R^4$ and $R^5$ together form a five-, six-, or seven-membered ring;
- $R^6$ is H, $C_{1-12}$ alkyl, or $C_{1-12}$ fluoroalkyl; or $R^4$ and $R^6$ together form a five-, six-, or seven-membered ring;
- $R^7$ is H, $C_{1-12}$ alkyl, or $C_{1-12}$ fluoroalkyl; or $R^7$ and $R^5$ together represent —X—$(CR^8R^9)_n$—, in which case $R^4$ and $R^6$ are H, X is O or $CH_2$, n is 1 or 2; and
- $R^8$ and $R^9$ are H, $C_{1-12}$ alkyl, or $C_{1-12}$ fluoroalkyl, or together form an oxo moiety (=O), with the proviso that when $R^8$ and $R^9$ together form =O, n is 1.

Further, any carbon atoms indicated in the aforementioned definitions as unsubstituted may in fact be substituted with one or more inert, nonhydrogen substituents such as, for the alicyclic groups, F or $C_{1-6}$ fluoroalkyl (preferably fluorinated methyl, i.e., $CFH_2$, $CHF_2$ or $CF_3$), and for other substituents, $C_{1-12}$ alkyl, $C_{1-12}$ alkoxy, $C_{1-12}$ alkenyl, $C_{1-12}$ alkenyloxy, $C_{1-12}$ fluoroalkyl, $C_{1-12}$ fluoroalkoxy, $C_{1-12}$ fluoroalkenyl, wherein any of the aforementioned substituents, with the example of F, may be further substituted with additional moieties, e.g., hydroxyl groups.

The copolymer may serve as either the base-soluble component of an unexposed resist or as an acid-labile material, i.e., by virtue of its containing acid-cleavable pendant groups such as acid-cleavable esters that cause it to release acid following irradiation due to the photoacid generator in the resist composition.

The present invention also relates to the use of the photoresist composition in a lithography method. The process involves: (a) coating a substrate (e.g., a ceramic, metal, or semiconductor substrate) with a film comprising a radiation-sensitive acid generator and a copolymer as provided herein; (b) exposing the film selectively to a predetermined pattern of radiation to form a latent image therein; and (c) developing the image using a suitable developer composition. The radiation may be ultraviolet, electron beam, or x-ray. Ultraviolet radiation is preferred, with particularly deep ultraviolet radiation having a wavelength of less than about 250 nm, e.g., 157 nm, 193 nm, or 248 nm. The pattern from the resist structure may then be transferred to the underlying substrate. Typically, the transfer is achieved by reactive ion etching or by an alternative etching technique. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc., as might be used in the design of integrated circuit devices.

DETAILED DESCRIPTION OF THE DRAWINGS

DETAILED DESCRIPTION OF THE INVENTION

Definitions and Nomenclature:

Before describing the present invention in detail, it is to be understood that unless otherwise indicated this invention is not limited to specific compositions, components, or process steps, as such may vary. It is also to be understood that the terminology used herein is for the purpose of describing particular embodiments only, and is not intended to be limiting.

It must be noted that, as used in this specification and the appended claims, the singular forms "a," "an," and "the" include plural referents unless the context clearly dictates otherwise. Thus, for example, reference to "a monomer" includes not only a single monomer but also a combination or mixture of two or more monomers that may or may not be the same, a "photoacid generator" includes a combination or mixture of two or more photoacid generators as well as a single photoacid generator, and the like.

In describing and claiming the present invention, the following terminology will be used in accordance with the definitions set out below.

The term "alkyl" as used herein refers to a branched or unbranched saturated hydrocarbon group of 1 to 24 carbon atoms, preferably 1 to 12 carbon atoms, such as methyl, ethyl, n-propyl, isopropyl, n-butyl, isobutyl, t-butyl, octyl, decyl, tetradecyl, hexadecyl, eicosyl, tetracosyl, and the like, as well as cycloalkyl groups such as cyclopentyl, cyclohexyl, and the like. The term "lower alkyl" intends an alkyl group of 1 to 6 carbon atoms, and the term "lower alkyl ester" refers to an ester functionality —C(O)O—R, wherein R is lower alkyl.

The term "alkylene" as used herein refers to a difunctional saturated branched or unbranched hydrocarbon chain containing from 1 to 24 carbon atoms, preferably 1 to 12 carbon atoms, and includes, for example, methylene(—$CH_2$—), ethylene(—$CH_2$—$CH_2$—), propylene(—$CH_2$—$CH_2$—$CH_2$—), 2-methylpropylene(—$CH_2$—$CH(CH_3)$—$CH_2$—), hexylene(—$(CH_2)_6$—), and the like.

The term "alkenyl" as used herein refers to a branched, unbranched or cyclic unsaturated hydrocarbon group of 2 to 24 carbon atoms, preferably 2 to 12 carbon atoms, and containing at least one double bond. Such groups include, for example, ethenyl, n-propenyl, isopropenyl, n-butenyl, isobutenyl, octenyl, decenyl, tetradecenyl, hexadecenyl, eicosenyl, tetracosenyl, and the like. The term "lower alkenyl" refers to an alkenyl group of 1 to 6 carbon atoms.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms. Analogously, "alkenyloxy" and "lower alkenyloxy" respectively refer to an alkenyl and lower alkenyl group bound through a single, terminal ether linkage, and "alkynyloxy" and "lower alkynyloxy" respectively refer to an alkynyl and lower alkynyl group bound through a single, terminal ether linkage.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable inert, nonhydrogen substituents include, for example, halo, haloalkyl (preferably halo-substituted lower alkyl), alkyl (preferably lower alkyl), alkoxy (preferably lower alkoxy), and the like. Unless otherwise indicated, the term "aryl" is also intended to include heteroaromatic moieties, i.e., aromatic heterocycles. Generally, although not necessarily, the heteroatoms will be nitrogen, oxygen, or sulfur.

The term "fluorinated" refers to replacement of a hydrogen atom in a molecule or molecular segment with a fluorine atom. The term "fluoroalkyl" refers to an alkyl group wherein at least one hydrogen atom has been replaced with a fluorine atom and includes, for example, trifluoromethyl, difluoromethyl, 2,2,2-trifluoroethyl, pentafluoromethyl, 3,3, 3-trifluoromethyl, etc. Similarly, the term "fluorocarbinol" refers to an alcohol moiety in which at least one of the hydrogen atoms bonded to a carbon atom has been replaced with a fluorine atom and includes, for example, —CF$_2$OH, —CH(CF$_3$)—OH, —C(CF$_3$)$_2$—OH, —CH$_2$CF$_2$OH, etc. The term "fluoroacid" refers to a carboxylic acid substituent in which at least one of the hydrogen atoms bonded to a carbon atom has been replaced with a fluorine atom and includes, for example, —CF$_2$COOH, —CH(CF$_3$)—COOH, —C(CF$_3$)$_2$—COOH, —CH$_2$CF$_2$COOH, etc. The term "perfluorinated" is also used in its conventional sense to refer to a molecule or molecular segment wherein all hydrogen atoms are replaced with fluorine atoms. Unless otherwise indicated, "fluorinated" substituents (such as fluoroalkyl and the like) include perfluorinated substituents.

The term "polymer" is used to refer to a chemical compound that comprises linked monomers and that may be linear, branched, or crosslinked. The polymer may be a homopolymer or a copolymer.

The terms "photogenerated acid" and "photoacid" are used interchangeably herein to refer to the acid that is created upon exposure of the present compositions to radiation, i.e., as a result of the radiation-sensitive acid generator in the compositions.

The term "substantially transparent" as used to describe a polymer that is "substantially transparent" to radiation of a particular wavelength and refers to a polymer that, at a selected wavelength, has an absorbance of less than about 5.0/μm, preferably less than about 4.0/μm, and most preferably less than about 3.5/μm.

For additional information concerning terms used in the field of lithography and lithographic compositions, reference may be had to *Introduction to Microlithography*, Eds. Thompson et al. (Washington, D.C.: American Chemical Society, 1994).

The Novel Copolymer:

The novel copolymer is prepared by copolymerization of a first monomer having the structure of formula (I)

and a second monomer having the structure of formula (II)

In formula (I), $R^1$, $R^{2a}$, $R^{2b}$, and $R^3$ are as defined previously, with preferred substituents as follows. $R^1$ is preferably H, F, CN, CF$_3$, CF$_2$H, CFH$_2$, or CH$_3$, $R^{2a}$ and $R^{2b}$ are independently H or F, and $R^3$ is CN or COOR, wherein R is selected from the group consisting of H, C$_{1-12}$ alkyl and C$_{1-12}$ fluoroalkyl, or is selected so as to render $R^3$ acid-cleavable. In preferred embodiments, when $R^3$ is CN, then $R^1$ is CF$_3$ and $R^2$ is H. Monomers suitable for use as the first monomer include, but are not limited to, methyl α-trifluoromethylacrylate, α-trifluoromethylacrylic acid, t-butyl α-trifluoromethylacrylate, and 2-trifluoromethyl-acrylonitrile.

Preferred first monomers have an acid-cleavable pendant group as the $R^3$ substituent, which undergoes a cleavage reaction in the presence of photogenerated acid to generate a carboxylic acid group. Typically, the reaction of acid-cleavable functional groups with photogenerated acid occurs only, or is promoted greatly by, the application of heat to the film. Those skilled in the art will recognize the various factors that influence the rate and ultimate degree of cleavage of acid-cleavable functional groups as well as the issues surrounding integration of the cleavage step into a viable manufacturing process. The product of the cleavage reaction is a polymer-bound carboxylic acid group, which, when present in sufficient quantities along the polymer backbone, imparts solubility to the polymer in basic aqueous solutions.

When selected to render the $R^3$ moiety acid-cleavable, R is preferably either tertiary alkyl (e.g., t-butyl) or a cyclic or alicyclic substituent (generally C$_3$-C$_{15}$, preferably C$_5$-C$_{12}$) with a tertiary attachment point such as 2-methyl-2-adamantyl, 2-methyl-2-isobornyl, 2-methyl-2-tetracyclododecenyl, 2-methyl-2-dihydrodicyclopentadienyl-cyclohexyl, 1-methylcyclopentyl, or 1-methylcyclohexyl. Other suitable acid-cleavable protecting groups may be found in U.S. Pat. No. 5,679,495 to Yamachika et al. or in the pertinent literature and texts (e.g., Greene et al., Protective Groups in Organic Synthesis, 2$^{nd}$ Ed. (New York: John Wiley & Sons, 1991)).

In the second monomer, $R^4$, $R^5$, $R^6$ and $R^7$ are as defined previously. Preferred substituents are as follows: $R^4$ is H, C$_{1-12}$ alkyl, or C$_{3-15}$ alicyclic; $R^5$ is C$_{1-12}$ alkyl, C$_{1-12}$ alkyl substituted with 1-12 fluorine atoms and 0-2 hydroxyl groups, or C$_{3-15}$ alicyclic, or $R^4$ and $R^5$ together form a five-, six-, or seven-membered ring; $R^6$ is H, C$_{1-12}$ alkyl, or C$_{1-12}$ fluoroalkyl; and $R^7$ is H, C$_{1-12}$ alkyl, or C$_{1-12}$ fluoroalkyl, or $R^7$ and $R^5$ together represent —X—(CR$^8$R$^9$)$_n$—, in which case $R^4$ and $R^6$ are H, X is O or CH$_2$, n is 1 or 2, $R^8$ and $R^9$ are H, C$_{1-12}$ alkyl, or C$_{1-12}$ fluoroalkyl, or together form an oxo moiety (=O). When $R^8$ and $R^9$ together form =O, n is 1. Suitable second monomers include, but are not limited to, ethyl vinyl ether, t-butyl vinyl ether, adamantylvinyl ethyl ether, methoxycyclohexene, methoxycycloheptene, dihydropyran, dihydrofuran, and vinylene carbonate.

In a preferred embodiment, the second monomer has the structure of formula (III)

(III)

wherein $R^4$ and $R^5$ are as defined above. Ethyl vinyl ether, adamantly-vinyl ethyl ether, and t-butyl vinyl ether are examples of suitable second monomers that fall within the structure of formula (III).

In alternative preferred embodiments, the second monomer has the structure of formula (IV), formula (V), or formula (VI)

wherein X is O or $CH_2$, n is 1 or 2, m is 1, 2, or 3, and $R^8$ and $R^9$ are H, $C_{1-12}$ alkyl, or $C_{1-12}$ fluoroalkyl. Dihydropyran, vinylene carbonate, and dihydrofuran are examples of suitable second monomers that fall within the structures of formula (IV) or formula (V). Methoxycyclohexene and methoxycycloheptene may also be used as a second monomer, as shown in formula (VI). Again, any carbon atoms shown as unsubstituted in the aforementioned structures may be substituted with one or more inert, nonhydrogen substituents, as indicated previously.

The copolymer may serve either as a base-soluble component of an unexposed resist or as an acid-labile component of a resist, i.e., a component that releases acid following irradiation by virtue of the photoacid generator in the resist composition and acid-cleavable pendant groups on the copolymer, either in the $R^3$ substituent in a polymer having structure (I) or in a comonomer (e.g., the comonomer could be t-butyl methacrylate or an alternative comonomer containing an acid-cleavable pendant group). Alternatively, or in addition, acid-cleavable pendant moieties may be present on a separate polymer that is admixed with the copolymer polymer in the resist composition.

The novel copolymer may additionally comprise different monomer units each having the structure (I) or structure (II), or more typically, a copolymer may comprise a monomer unit having the structure (I) and one or more other monomer units, typically formed from addition polymerizable monomers, preferably vinyl monomers, for example, to enhance the performance of the photoresist. Thus, the polymer may contain minor amounts of acrylic acid or methacrylic acid monomer (e.g., 5-30%) to enhance development. The copolymer may also contain other suitable monomer units, such as hydroxystyrene, to enhance development and etch resistance, or a silicon-containing monomer unit (e.g., a silicon-containing acrylate, methacrylate, or styrene) to enhance oxygen plasma etch resistance for bilayer applications. In general, suitable comonomers include, but are not limited to, the following ethylenically unsaturated polymerizable monomers: acrylic and methacrylic acid esters and amides, including alkyl acrylates, aryl acrylates, alkyl methacrylates, and aryl methacrylates (e.g., methyl acrylate, methyl methacrylate, n-butyl acrylate, n-butyl methacrylate, t-butyl acrylate, t-butyl methacrylate, 2-ethylhexyl methacrylate, benzyl acrylate, and N-phenylacrylamide); vinyl aromatics, including unsubstituted styrene and styrene substituted with one or two lower alkyl, halogen, or hydroxyl groups (e.g., styrene derivatives such as 4-vinyltoluene, 4-vinylphenol, α-methylstyrene, 2,5-dimethylstyrene, 4-t-butylstyrene and 2-chlorostyrene); butadiene; vinyl acetate; vinyl bromide; vinylidene chloride; and $C_5$-$C_{20}$, generally $C_7$-$C_{15}$, cyclic olefin monomers such as norbornene and tetracyclododecene; fluorinated analogs of any of the foregoing, including fluorinated acrylic and methacrylic acid esters (e.g., fluorinated alkyl acrylates, fluorinated aryl acrylates, fluorinated alkyl methacrylates, and fluorinated aryl methacrylates); and others readily apparent to one skilled in the art. For use in 157 nm lithography, fluorinated comonomers are preferred.

The copolymers may be hydrophobic and can be used in a lithographic resist material in a blend with other hydrophilic polymers such as, for example, poly{bicyclo[2.2.1]hept-5-ene-2-(1,1,1-trifluoro-2trifluoromethylpropan-2-ol} (PNBHFA).

The novel copolymers may also exhibit a reduced glass transition temperature ($T_g$), in sharp contrast to a high transition temperatures observed with α-trifluoromethylacrylate-norbornene copolymers. High $T_g$ polymer films tend to crack, especially upon aqueous base development, adhere poorly to substrates, and are more susceptible to airborne contamination.

Monomer Synthesis and Polymerization:

Monomers having the structure of formulae (I) and (II) may be readily synthesized using methods described in the pertinent texts and literature, or as known to those of ordinary skill in the art. Methods for synthesizing representative monomers are described in the Examples.

For example, the copolymers of the invention may be prepared by radical copolymerization using a suitable free radical initiator. Radical polymerization is easy to run, economical, and highly suited for preparation of resist polymers. The initiator may be any conventional free radical-generating polymerization initiator. Examples of suitable initiators include peroxides such as O-t-amyl-O-(2ethylhexyl)monoperoxycarbonate, dipropylperoxydicarbonate, and benzoyl peroxide (BPO), as well as azo compounds such as azobisisobutyronitrile (AIBN), 2,2'-azobis(2-amidinopropane)dihydrochloride, and 2,2'-azobis(isobutyramide)dihydrate. The initiator is generally present in the polymerization mixture in an amount of from about 0.2 to 20 mol % relative to the monomers. With radical polymerization, the resulting copolymer typically has a number average molecular weight in the range of approximately 2,000 to 500,000, generally in the range of approximately 2,000 to 300,000.

The Photoacid Generator:

The second component of the resist composition is a photoacid generator ("PAG"). Upon exposure to radiation, the photoacid generator generates a strong acid. A variety of photoacid generators can be used in the composition of the present invention. The photosensitive acid generators used in the photoresist compositions of the invention may be any suitable photosensitive acid generator known in the photoresist art that is compatible with the other components of the photoresist composition. Examples of preferred photoresist acid generators (PAGs) include: α-(trifluoromethylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide (DDSN) may be used. Combinations of PAGs may be used as well.

Generally, suitable acid generators have a high thermal stability (preferably to temperatures greater than 140° C.) so they are not degraded during pre-exposure processing. In addition to MDT and DDSN, other suitable PAGs include other sulfonate salts as well as sulfonated esters and sulfonyloxy ketones. See U.S. Pat. No. 5,344,742 to Sinta et al. and J. Photopolymer Science and Technology 4:337-340 (1991) for disclosure of suitable sulfonate PAGs, including benzoin tosylate, t-butylphenyl α-(p-toluenesulfonyloxy)-acetate, and t-butyl α-(p-toluenesulfonyloxy)-acetate.

Onium salts are also generally preferred acid generators of compositions of the invention. Onium salts that contain weakly nucleophilic anions have been found to be particularly suitable. Examples of such anions are the halogen complex anions of divalent to heptavalent metals or nonmetals, for example, Sb, B, P, and As. Examples of suitable onium salts are aryl-diazonium salts, halonium salts, aromatic sulfonium, salts and sulfoxonium salts or selenium salts (e.g., triarylsulfonium and diaryliodonium hexafluoroantimonates, hexafluoroarsenates, and trifluoromethanesulfonates). Examples of preferred onium salts can be found in U.S. Pat. Nos. 4,442,197, 4,603,101, and 4,624,912.

Other useful acid generators include the family of nitrobenzyl esters and the s-triazine derivatives. Suitable s-triazine acid generators are disclosed, for example, in U.S. Pat. No. 4,189,323.

Still other suitable acid generators include, but are not limited to, N-camphorsulfonyloxynaphthalimide; N-pentafluorophenylsulfonyloxynaphthalimide, ionic iodonium sulfonates (e.g., diaryl iodonium (alkyl or aryl) sulfonate and bis-(di-t-butylphenyl)iodonium camphanylsulfonate); ionic iodonium perfluoroalkanesulfonates (such as di-(4-t-butylphenyl)iodonium pentafluorooctane sulfonate, "IPFOS"), aryl (e.g., phenyl or benzyl) triflates and derivatives and analogs thereof (e.g., triphenylsulfonium triflate or bis-(t-butylphenyl)iodonium triflate), pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones.

Other suitable photoacid generators are disclosed in Reichmanis et al. (1991), Chemistry of Materials 3:395, and in U.S. Pat. No. 5,679,495 to Yamachika et al. Additional suitable acid generators useful in conjunction with the compositions and methods of the invention will be known to those skilled in the art and/or are described in the pertinent literature.

The Resist Composition:

The photoresist composition herein comprises both the novel copolymer (as described in detail above) and an acid generator, with the copolymer representing up to about 99 wt. % of the solids included in the composition, and the photoacid generator representing approximately 0.5-10 wt. % of the solids contained in the composition. Other components and additives may also be present.

For example, a positive photoresist composition may include a dissolution inhibitor; and a negative photoresist composition will include a crosslinking agent. If dissolution inhibitors and crosslinking agents are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in both the resist composition and the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, exhibit a moderating influence on $T_g$, strong etch resistance, and display good thermal stability (i.e., stability at temperatures of about 140 C. or greater). Suitable dissolution inhibitors include, but are not limited to, bisphenol A derivatives and carbonate derivatives, for example, bisphenol A derivatives wherein one or both hydroxyl moieties are converted to a t-butoxy substituent or a derivative thereof, such as a t-butoxycarbonyl or t-butoxycarbonylmethyl group; fluorinated bisphenol A derivatives such as $CF_3$-bisphenol A—$OCH_2(CO)$—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; cyclic acetal groups such as tetrahydrofuranyl, tetrahydropyranyl, and 2-methoxytetrahydropyranyl groups; and androstane-17-alkylcarboxylates and analogs thereof, wherein the 17-alkylcarboxylate at the 17-position is typically lower alkyl. Examples of such compounds include lower alkyl esters of cholic, ursocholic, and lithocholic acid, including methyl cholate, methyl lithocholate, methyl ursocholate, t-butyl cholate, t-butyl lithocholate, t-butyl ursocholate, and the like (see, e.g., Allen et al. (1995) J. Photopolym. Sci. Technol., cited supra); hydroxyl-substituted analogs of such compounds (ibid.); and androstane-17-alkylcarboxylates substituted with one to thee $C_1$-$C_4$ fluoroalkyl carbonyloxy substituents such as t-butyl trifluoroacetyllithocholate (see, e.g., U.S. Pat. No. 5,580,694 to Allen et al.).

The crosslinking agent used in the photoresist compositions of the invention may be any suitable crosslinking agent known in the negative photoresist art, which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDER-LINK trademark from American Cyanamid Company. Other suitable crosslinking agents can also be found in Japanese Laid-Open Patent Application (Kokai) No. 1-293339, as well as etherified amino resins (for example, methylated or butylated melamine resins (N-methoxymethyl- or N-butoxymethyl-melamine, respectively)), or methylated/butylated glycolurils (for example as can be found in Canadian Patent No. 1 204 547). Combinations of crosslinking agents may be used.

The remainder of the resist composition is composed of a solvent and may additionally, if necessary or desirable, include customary additives such as dyes, sensitizers, stabilizers, acid-diffusion controlling agents, coating aids (such as surfactants or anti-foaming agents), adhesion promoters, and plasticizers.

The choice of solvent is governed by many factors and is not limited to the solubility and miscibility of resist components, the coating process, and safety and environmental regulations. Additionally, inertness to other resist components is desirable. It is also desirable that the solvent possess the appropriate volatility to allow uniform coating of films, yet also allow significant reduction or complete removal of residual solvent during the post-application bake process. See, e.g., *Introduction to Microlithography*, Eds. Thompson et al., cited previously. In addition to the above components, the photoresist compositions of the invention generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials; otherwise the unwanted intermixing may occur. Examples of suitable casting solvents include: ethoxyethylpropionate (EEP); a combination of EEP and γ-butyrolactone (GBL); PGMEA; and ethyl lactate. The invention is not limited to selection of any particular solvent. Solvents may generally be chosen from ether-, ester-, hydroxyl-, and ketone-containing compounds, or mixtures of these compounds. Examples of appropriate solvents include: cyclopentanone; cyclohexanone; lactate esters, such as ethyl lactate; alkylene glycol alkyl ether esters, such as propylene glycol methyl ether acetate; alkylene glycol monoalkyl esters, such as methyl cellosolve; butyl acetate; 2-ethoxyethanol; and ethyl 3-ethoxypropionate. Preferred solvents include PGMEA, EEP, and their mixtures.

The above list of solvents is for illustrative purposes only and should not be viewed as being comprehensive, nor should the choice of solvent be viewed as limiting to the invention in any way. Those skilled in the art will recognize that any number of solvents or solvent mixtures may be used. Greater than 50 percent of the total mass of the resist formulation is typically composed of the solvent, preferably greater than 80 percent.

Other customary additives include dyes that may be used to adjust the optical density of the formulated resist, and sensitizers that enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicities may be used as stabilizers and acid-diffusion controlling additives. They may include nitrogenous compounds, such as aliphatic primary, secondary, and tertiary amines; cyclic amines such as piperidines; pyrimidines; morpholines; aromatic heterocyclics such as pyridines; pyrimidines; purines; imines such as diazabicycloundecene; guanidines; imides; amides; and others. Ammonium salts may also be used, including ammonium, primary, secondary, tertiary, and quaternary alkyl- and arylammonium salts of alkoxides (e.g., hydroxide, phenolates, carboxylates, aryl and alkyl sulfonates, sulfonamides, and others). Other cationic nitrogenous compounds, including pyridinium salts and salts of other heterocyclic nitrogenous compounds with anions such as alkoxides (e.g., hydroxide, phenolates, carboxylates, aryl and alkyl sulfonates, sulfonamides, and the like), may also be employed. Surfactants may be used to improve coating uniformity, and include a wide variety of ionic and non-ionic, monomeric, oligomeric, and polymeric species.

Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers (such as oligo- and polyethyleneglycol ethers, cycloaliphatic esters, and non-acid reactive steroidally derived materials) may be used as plasticizers if desired. Neither the classes of compounds nor the specific compounds mentioned above, however, are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation; preferably, less than 5 percent.

Use in Generation of Resist Images on a Substrate:

The present invention also relates to a process for generating a resist image on a substrate comprising the steps of: (a) coating a substrate with a film comprising the resist composition of the present invention; (b) imagewise exposing the film to radiation; and (c) developing the image. The first step involves coating the substrate with a film comprising the resist composition dissolved in a suitable solvent. Suitable substrates are ceramic, metallic, or semiconductive; preferred substrates are silicon-containing and include, for example, silicon dioxide, silicon nitride, and silicon oxynitride. The substrate may or may not be coated with an organic anti-reflective layer prior to deposition of the resist composition. Alternatively, a bilayer resist may be employed wherein a resist composition of the invention forms an upper resist layer (i.e., the imaging layer), and the underlayer is comprised of a material that is highly absorbing at the imaging wavelength and compatible with the imaging layer.

Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90-150° C. for a short period of time, typically on the order of about 1 minute. The dried film has a thickness of about 0.02-5.0 µm, preferably about 0.05-2.5 µm, most preferably about 0.10 to 1.0 µm. In the second step of the process, the film is imagewise exposed to radiation. The radiation may be ultraviolet, electron beam, or x-ray. Ultraviolet radiation is preferred, particularly deep ultraviolet radiation having a wavelength of less than about 250 nm (e.g., 157 nm using an $F_2$ excimer laser). The radiation is absorbed by the radiation-sensitive acid generator to generate free acid, which when heated, causes cleavage of the acid-cleavable pendant groups and, hence, formation of the corresponding acid. After the film has been exposed to radiation, the film may again be heated to an elevated temperature of about 90-150° C. for a short period of time, on the order of about 1 minute. It will be appreciated by those skilled in the art that the aforementioned description applies to a positive resist, and with a negative resist, the exposed regions would typically be crosslinked by acid.

The third step involves development of the image with a suitable solvent. Suitable solvents include an aqueous base, preferably an aqueous base without metal ions, such as the industry standard developer, tetramethylammonium hydroxide or choline. Because the fluorinated polymer of the resist composition is substantially transparent at 157 nm, the resist composition is uniquely suitable for use at that wavelength. However, the resist may also be used with other ultraviolet wavelengths, e.g., 193 nm and 248 nm, or with electron beam or x-ray radiation.

The pattern from the resist structure may then be transferred to the material of the underlying substrate. Typically, the transfer is achieved by reactive ion etching or some other etching technique. Thus, the compositions of the invention and resulting resist structures can be used to create patterned material layer structures, such as metal wiring lines, holes for contacts or vias, insulation sections (e.g., damascene trenches or shallow trench isolation), trenches for capacitor structures, etc., as might be used in the design of integrated circuit devices. Accordingly, the processes for making these features involves, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the developed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions, e.g., boron, phosphorous, or arsenic, can be implanted in the substrate in the process for making p-doped or n-doped circuit transistors. Examples of such processes are disclosed in U.S. Pat. Nos. 4,855,017; 5,362,663; 5,429,710; 5,562,801; 5,618,751; 5,744,376; 5,801,094; and 5,821,469. Other examples of pattern transfer processes are described in Chapters 12 and 13 of Moreau, *Semiconductor Lithography: Principles, Practices, and Materials* (Plenum Press, 1988). It should be understood that the invention is not limited to any specific lithographic technique or device structure.

It is to be understood that while the invention has been described in conjunction with the preferred specific embodiments thereof, that the foregoing description as well as the examples that follow are intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

EXPERIMENTAL

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight; temperature is in degrees Celsius; and pressure is at or near atmospheric.

Abbreviations:

The following abbreviations are used throughout the Experimental section.

| | |
|---|---|
| AdEVE | Adamantylvinyl ethyl ether |
| AIBN | 2,2'-Azobis(isobutyronitrile) |
| DHF | Dihydrofuran |
| EtOAc | Ethyl acetate |
| DHPY | Dihydropyran |
| EVE | Ethyl vinyl ether |
| MOCH | Methoxycyclohexene |
| MOCHP | Methoxycycloheptene |
| MTMFA | Methyl α-trifluoromethylacrylate |
| TBTFMA | t-Butyl α-trifluoromethylacrylate |
| TBVE | t-Butyl vinyl ether |
| TFMAA | α-Trifluoromethylacrylic acid |
| TMAH | Tetramethyl ammonium hydroxide |
| VCARB | Vinylene carbonate |

Measurements:

NMR spectra were recorded on a Bruker AF250, AC300, AM500, or Avance 400 spectrometer. GPC was performed in tetrahydrofuran on a Waters Model 150 chromatograph equipped with µ-Styragel columns. The molecular weight values are relative to polystyrene standards. UV measurements of polymer films coated on $CaF_2$ substrates were performed at 157 mn on multiple thicknesses using a Varian Cary Model 400 spectrophotometer modified for measurements down to 140 nm in a $N_2$ atmosphere. A quartz crystal microbalance (QCM) was used to study the dissolution kinetics of the polymer films in aqueous TMAH solution (CD-26). The kinetics of radical copolymerization were monitored in situ at 70° C. by 300 MHz $^1$H NMR (Bruker AC300) using AIBN as the initiator, and dioxane-$d_8$ was used as a polymerization and NMR solvent.

Materials:

EVE, TBVE, and DHF were purchased from Aldrich, and DHPY, from Lancaster. MOCH and MOCHP were synthesized according to the method taught by Schmidt et al. (1962) "OzonisierungCyclischer Enolather," *Liebigs Ann. Chem.* 656:97-102. AIBN purchased from Aldrich was purified by recrystallization from methanol. The polymerization solvent employed was EtOAc or p-dioxane-$d_8$. PNBHFA was obtained from BF Goodrich Company (now Promerus Electronic Materials).

Example 1

Preparation of α-(TRIFLUOROMETHYL)ACRYLONITRILE (TFMAN)

(a) 1,1,1-Trifluoroacetone cyanohydrin: To a stirred and cooled solution of 127.2 g (2.6 mol) sodium cyanide in 544 mL water was added dropwise 300 g (2.68 mol) of 1,1,1-trifluoroacetone. This solution was cooled to 4° C. and a cooled solution of 6N sulfuric acid (910 g) was added slowly with mechanical stirring keeping the temperature below 10° C. After stirring overnight at room temperature the reaction was extracted with diethyl ether, the extracts dried with sodium sulfate, filtered, and evaporated. The residue was distilled under reduced pressure (50 mm Hg) and the fractions boiling between 40-80° C. were collected and mixed with an equal volume of diethyl ether then stirred with sodium sulfate overnight. Filtration, evaporation, distillation, and sodium sulfate treatment of the residue was repeated twice to obtain 270 g (72%) of cyanohydrin (b.p.: 76-79° C./50 mm).

(b) 1,1,1-Trifluoroacetone cyanohydrin acetate: Triethylamine (194.3 g, 1.924 mol) was added dropwise to a stirred solution of 269 g (1.935 mol) of the cyanohydrin prepared in part (a), 202.7 g (1.987 mol) of acetic anhydride, 320 mL of methylene chloride, and 630 mg of 4-dimethylaminopyridine cooled to 4° C. After stirring overnight at room temperature the reaction was diluted with 200 mL water and extracted with methylene chloride. The methylene chloride extract was dried with sodium sulfate, filtered, concentrated, and distilled. The product acetate (321 g, 91%) was collected at 81-82° C./50 mm Hg.

(c) 2-(Trifluoromethyl)acrylonitrile: A total of 320 g (1.7 mol) of the cyanohydrin acetate prepared in part (b) was passed in a slow stream of nitrogen through a heated (500-550° C.) glass tube packed with glass tubing pieces. The pyrolysis product was collected via trap cooled in liquid nitrogen. The crude pyrolysis product was purified by fractional distillation to yield 139 g (65%) of pure 2-(trifluoromethyl)acrylonitrile. Fractions with purity greater than 99.5% (GC) were used for polymerization: bp 75-77° C. [lit. bp 75.9-76.2° C. (759 mm)]; $^1$H NMR (60 MHz, neat) δ 6.62 and 6.70 (CH$_2$); $^{13}$C NMR (20 MHz, CDCl$_3$) δ 112.2 (CN), 115.4 (αC) ($J_{CF}$≃40 Hz), 120.3 (CF$_3$) ($J_{CF}$=272.5 Hz), 138.4 (CH$_2$) ($J_{CF}$=3.8 Hz).

Example 2

Preparation of 2-(TRIFLUOROMETHYL)ACRYLIC ACID (TFMAA)

(a) 3-Hydroxy-2-(trifluoromethyl)propionic acid: TFMAN (60 g, 0.496 mol) was added dropwise to 169 g of sulfuric acid (1.725 mol) which was stirred mechanically and heated to 120-130° C. After the addition was complete the mixture was stirred for an additional 30 minutes at 120-130° C. The mixture was allowed to cool slightly, 170 mL of water was added, and the reaction heated for 5 hours at 120° C. The cooled reaction mixture was extracted with several portions of diethyl ether, the ether extracts washed with brine, dried with sodium sulfate, filtered and, evaporated to yield 68.5 g (86%) of the hydroxy-acid as a colorless syrup.

(b) 2-(Trifluoromethyl)acrylic acid (TFMAA): Syrupy 3-hydroxy-2-(trifluoromethyl)propionic acid (73 g, 0.459 mol) was slowly added to 24 g of phosphorus pentoxide (0.085 mol) while avoiding excessive heat evolution. The mixture was cautiously heated to 160-200° C. while collecting the product with an air-cooled short path distillation apparatus as it distilled from the mixture. The solid product was redistilled, collecting pure product fractions (b.p. 157-160° C.) totaling 50.5 g (79%).

Example 3

Preparation of METHYL α-(TRIFLUOROMETHYL)ACRYLATE (MTFMA)

Methyl α-(Trifluoromethyl)acrylate was synthesized by a modification of the method described by Buxton (1954) *J. Chem. Soc.*, p. 366, as follows: Direct methanolysis of the cyanohydrin of 1,1,1-trifluoroacetone (prepared in Example 1, part (a)) gave methyl α-hydroxy-α-(trifluoromethyl)propionate in ca. 70% yield. The α-hydroxyl group was esterified by treating the propionate with acetic anhydride, triethylamine, and 4-(dimethylamino)pyridine in methylene chloride to give methyl α-acetoxy-α-(trifluoromethyl)propionate in ca. 75% yield. Pyrolysis of the ester acetate yielded MTFMA in ca. 62% yield. After ether extraction of the crude pyrolysis product, MTFMA was purified by fractional distillation and purity assayed by gas chromatography (GC). Fractions purer than 99.5% were used for all polymerizations: bp 104-105° C., lit. bp 103.8-105° C.; $^1$H NMR (60 MHz, CDCl$_3$) δ 3.80 (CH$_3$O), 6.40 and 6.67 (CH$_2$); $^{13}$C NMR (20 MHz, CDCl$_3$) δ 53.2 (CH$_3$O); 122.2 (CF$_3$) ($J_{CF}$=274 Hz), 133.2 (CH$_2$) ($J_{CF}$≃5 Hz), 133.2 (αC), ($J_{CF}$≃50 Hz), 162.7 (C=O).

Example 4

Preparation of t-BUTYL 2-(TRIFLUOROMETHYL)ACRYLATE (TBTFMA)

Oxalyl chloride (87.3 g, 0.68 mol) was added to a solution of TFMAA (15.0 g, 0.11 mol) in methylene chloride (90 mL) in a dropwise manner at room temperature under a nitrogen atmosphere. The solution was heated to reflux for 5 hours, and the solvent and excess reagent were removed on a rotary evaporator. The resulting acid chloride was added to a stirred solution consisting of t-butanol (44 g, 0.59 mmol) and pyridine (33.6 g, 0.42 mol) in dichloromethane at 0O C. over a 10 min period. After stirring overnight at room temperature, the solution was neutralized with diluted aqueous HCl and washed with saturated aqueous sodium bicarbonate. The organic phase was removed, and the aqueous phase was extracted with pentane. The combined organic solvents were reduced to a small volume by distillation and then the residue was chromatographed on a column of silica gel. The product was re-purified by distillation to give 14.0 g of TBTFMA as a colorless liquid (70%).

Example 5

RADICAL COPOLYMERIZATION OF TBTFMA WITH TBVE

TBTFMA (9.1 g), TBVE (5.04 g), and AIBN (0.6574 g) were dissolved in 30 g of EtOAc in a three-neck flask equipped with a condenser and a nitrogen inlet. The solution was de-aerated by bubbling N$_2$ for 30 minutes at room temperature. The solution in a N$_2$ atmosphere was then placed in an oil bath maintained at 60° C. After 28 hours the reaction mixture was cooled to room temperature and diluted with acetone/chloroform. The copolymer was precipitated into a large excess of methanol, isolated by filtration, dissolved in acetone/chloroform, and precipitated into methanol. The copolymer was washed with methanol and dried at 50° C. in a vacuum oven overnight, amounting to 12.85 g (87% yield). The weight-average (M$_w$) and number-average molecular weights (M$_n$) determined by gel permeation chromatography (GPC) were 55,100 and 237,300, respectively. The composition of the copolymer, as determined by inverse-gated $^1$H-decoupled $^{13}$C NMR (62.9 MHz) in acetone-$d_6$, was TBTFMA/TBVE=51/49.

Example 6

RADICAL COPOLYMERIZATION OF TBTFMA WITH EVE

A mixture of TBTFMA (9.9 g), EVE (3.68 g), and AIBN (0.6558 g) in 41 g of EtOAc was de-aerated by bubbling $N_2$ and heated at 60° C. for 42 hours under $N_2$. After cooling, the reaction mixture was diluted with acetone and poured into methanol to precipitate the polymer. The polymer was purified by precipitation into methanol, washed with methanol, and dried at 50° C. in a vacuum oven overnight. The yield was 80%. $M_n$ and $M_w$ were 80,300 and 181,800, respectively, while the composition was TBTFMA/EVE=65/35.

Example 7

RADICAL COPOLYMERIZATION OF TBTFMA WITH DHF

A mixture of TBTFMA (9.81 g), DHF (3.51 g), and AIBN (0.6572 g) was de-aerated and heated at 60° C. under $N_2$ for 23 hours. The product was dissolved in acetone and precipitated in methanol/water. The isolated polymer was redissolved in acetone, reprecipitated in methanol/water, and recovered by filtration. The polymer was dried at 50° C. in a vacuum oven overnight. The copolymer was obtained in an 82% yield and had an $M_n$ of 2,700 and $M_w$ of 4,100, respectively. The composition was TBTFMA/DHF=58/42.

Example 8

RADICAL COPOLYMERIZATION OF TBTFMA WITH VCARB

A de-aerated mixture of TBTFMA (9.82 g), VCARB (4.34 g), and AIBN (0.6562 g) was heated at 60° C. under $N_2$ for 24 hours. The product was dissolved in acetone and poured into methanol/water. The precipitated polymer was isolated by filtration and redissolved in acetone. The polymer was precipitated into hexanes this time, then isolated, washed with hexanes, and dried at 50° C. in a vacuum oven overnight. The copolymer obtained in a 23% yield had a composition of TBTFMA/VCARB=57/43. The $M_n$ and $M_w$ were 6,000 and 10,000, respectively.

Example 9

RADICAL COPOLYMERIZATION OF TFMAA WITH MOCH

Figure 1:
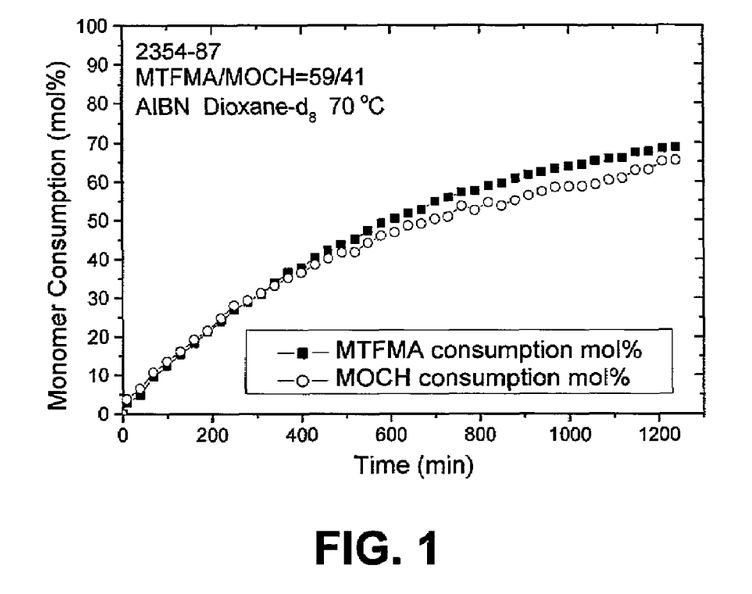
FIG. 1 is a graph depicting the monomer consumption kinetics curves obtained during the radical copolymerization of methyl α-trifluoromethylacrylate and methoxycyclohexene (59/41 molar ratio in the initial feed) with 5 mol % 2,2'-azobis(isobutyronitrile) in dioxane-$d_8$ at 70° C. as studied in situ by using $^1H$ NMR (300 MHz), as described in Example 9.
Figure 2:
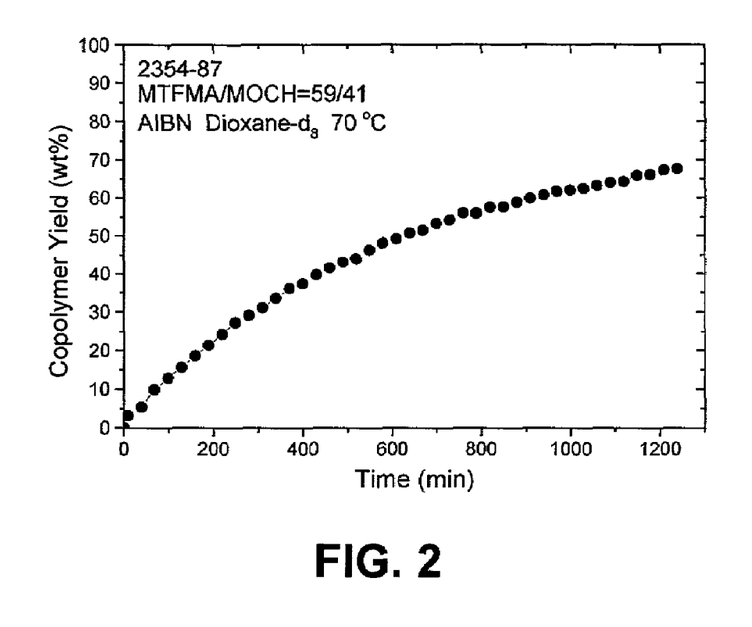
FIG. 2 is a graph illustrating copolymer yield as a function of polymerization time obtained during the radical copolymerization of methyl α-trifluoromethylacrylate and methoxycyclohexene (59/41 molar ratio in the initial feed) with 5 mol % 2,2'-azobis (isobutyronitrile) in dioxane-$d_8$ at 70° C., as described in Example 9.

TFMAA, MOCH (59/41 molar ratio in the initial feed) and 5 mol % AIBN were copolymerized in dioxane-$d_8$ at 70° C. The consumption kinetics during the copolymerization are presented in FIG. 1 and a graph illustrating the copolymer yield as a function of polymerization time is presented in FIG. 2.

Example 10

RADICAL COPOLYMERIZATION OF TBTFMA

Table I displays a summary of conditions and results of radical copolymerization of TBTFMA with vinyl ethers, and VCARB with 2 mol % AIBN in EtOAc at 60° C. A 1:1 bulk copolymerization of TBTFMA and TBVE resulted in solidification in less than 5 minutes, yielding a high molecular weight polymer ($M_n$=50,930 and $M_w$=268,580) of 52/48 composition. A solution copolymerization of the same monomer pair in ethyl acetate (EtOAc) also produced a high molecular weight 51/49 copolymer ($M_n$=55,130 and $M_w$=237,300) in 87 wt % yield within 28 hours at 60° C. EVE worked as well as TBVE in a 1:1 copolymerization with TBTFMA, providing a high molecular weight polymer ($M_n$=80,300 and $M_w$=181,800) in high yield (80% in 42 hours) in EtOAc. The copolymer composition was TBTFMA/EVE=65/35 in this case. DHF, a cyclic vinylene ether, copolymerized well with TBTFMA, producing a 58/42 copolymer in 82% yield in 23 hours. The molecular weight was low in this case ($M_n$=2,730 and $M_w$=4,080). Terpolymerization of TBTFMA, DHF, and NBHFA produced an interesting terpolymer (59/4/37 from 50/25/25). Furthermore, VCARB has been found to copolymerize with α-trifluoromethylacrylate. These copolymers do not absorb at all at 248 and 193 nm and possess good transparency at 157 nm, despite a large concentration of nonfluorinated vinyl ether units (optical density=3.3-3.8/μm, 4.2-4.5/μm).

TABLE I

| RADICAL COPOLYMERIZATION OF TBTFMA WITH VINYL ETHERS | | | | | | | | | | |
|---|---|---|---|---|---|---|---|---|---|---|
| $M_1$ (mol) | $M_2$ (mol) | $M_3$ (mol) | Solvent | Time (hr) | Yield (%) | Polymer Composition | Mn | Mw | Tg | $OD_{157}$ (μm$^{-1}$) |
| TBTFMA (0.05) | TBVE (0.05) | | | <5 min | >49 | 52/48 | 50,930 | 268,580 | 122 | |
| TBTFMA (0.05) | TBVE (0.05) | | EtOAc (30 g) | 28 | 87 | 51/49 | 55,130 | 237,300 | 125 | 3.7-3.8 |
| TBTFMA (0.05) | EVE (0.05) | | EtOAc (41 g) | 42 | 80 | 65/35 | 80,300 | 181,800 | 66 | 3.3-3.6 |
| TBTFMA (0.05) | DHF (0.05) | | | 23 | 82 | 58/42 | 2,730 | 4,080 | 89 | 3.8 |
| TBTFMA (0.05) | DHF (0.025) | NBHFA (0.025) | | 43 | 21 | 59/4/37 | 6,450 | 9,990 | | |
| TBTFMA (0.05) | VCARB (0.05) | | | 24 | 23 | 57/43 | 5,980 | 10,020 | | 4.2-4.5 |

I claim:

1. A copolymer prepared by copolymerization of:
a first monomer having the structure of formula (I)

wherein
$R^1$ is H, F, CN, $CH_3$, or $C_{1-6}$ fluoroalkyl,
$R^{2a}$ and $R^{2b}$ are independently H or F, and
$R^3$ is CN or COOR, wherein R is selected from the group consisting of H, $C_{1-12}$ alkyl and $C_{1-12}$ fluoroalkyl, or is selected so as to render $R^3$ acid-cleavable; and
a second monomer having the structure of formula (II)

wherein
$R^4$ is H, $C_{1-12}$ alkyl, $C_{3-15}$ alicyclic, or fluorinated $C_{3-15}$ alicyclic,
$R^5$ is $C_{1-12}$ alkyl, $C_{1-12}$ alkyl substituted with 1-12 fluorine atoms and 0-2 hydroxyl groups, or $C_{3-15}$ alicyclic, or $R^4$ and $R^5$ together form a five-, six-, or seven-membered ring,
$R^6$ is H, $C_{1-12}$ alkyl, or $C_{1-12}$ fluoroalkyl, or $R^4$ and $R^6$ together form a five-, six-, or seven-membered ring, and
$R^7$ is H, $C_{1-12}$ alkyl, or $C_{1-12}$ fluoroalkyl, or $R^7$ and $R^5$ together represent —X—$(CR^8R^9)_n$—, in which case $R^4$ and $R^6$ are H, X is O or $CH_2$, n is 1 or 2, $R^8$ and $R^9$ are H, $C_{1-12}$ alkyl, or $C_{1-12}$ fluoroalkyl, or together form an oxo moiety (=O), with the proviso that when $R^8$ and $R^9$ together form =O, n is 1,
wherein: (1) any of $R^1$, $R^3$, $R^4$, $R^5$, $R^6$, and $R^7$ may be further substituted with an inert, nonhydrogen substituent; (2) when $R^5$ is $C_{1-12}$ alkyl, at least one of $R^4$, $R^6$ and $R^7$ is other than hydrogen; and (3) at least one of the first monomer and the second monomer contains one or more fluorine atoms.

2. The copolymer of claim 1, wherein $R^1$ and $R^2$ are F and $R^3$ is COOR.

3. The copolymer of claim 2, wherein R is $C_{1-12}$ alkyl.

4. The copolymer of claim 2, wherein R is selected to render $R^3$ acid-cleavable.

5. The copolymer of claim 4, wherein R is a tertiary alkyl substituent.

6. The copolymer of claim 5, wherein R is t-butyl.

7. The copolymer of claim 5, wherein R is a $C_5$-$C_{12}$ cyclic or alicyclic substituent with a tertiary attachment point.

8. The copolymer of claim 7, wherein R is selected from the group consisting of 2-methyl-2-adamantyl, 2-methyl-2-isobornyl, 2-methyl-2-tetracyclododecenyl, 2-methyl-2-dihydrodicyclopentadienyl-cyclohexyl, 1-methylcyclopentyl, and 1-methylcyclohexyl.

9. The copolymer of claim 1, wherein $R^1$ is CN and $R^2$ is H.

10. The copolymer of claim 1, wherein the second monomer has the structure of formula (III)

wherein:
$R^4$ is $C_{1-12}$ alkyl, $C_{3-15}$ alicyclic, or fluorinated $C_{3-15}$ alicyclic; and
$R^5$ is $C_{1-12}$ alkyl, $C_{1-12}$ alkyl substituted with 1-12 fluorine atoms and 0-2 hydroxyl groups, or $C_{3-15}$ alicyclic.

11. The copolymer of claim 1, wherein the second monomer has a structure selected from the group consisting of (IV), (V), and (VI)

wherein:
$R^6$ is H, $C_{1-12}$ alkyl, or $C_{1-12}$ fluoroalkyl;
$R^7$ is H, $C_{1-12}$ alkyl, or $C_{1-12}$ fluoroalkyl;
X is O or $CH_2$;
m is an integer between 1 and 3; and
$R^8$ and $R^9$ are H, $C_{1-12}$ alkyl, or $C_{1-12}$ fluoroalkyl.

12. The copolymer of claim 1, wherein the copolymer is substantially transparent to radiation having a wavelength of less than about 250 nm.

13. The copolymer of claim 12, wherein the copolymer is substantially transparent to radiation having a wavelength of less than about 193 nm.

14. The copolymer of claim 13, wherein the copolymer is substantially transparent to radiation having a wavelength of 157 nm.

15. The lithographic photoresist composition of claim 13, further comprising a second polymer.

16. The copolymer of claim 1, further comprising at least one additional monomer having a structure that is different that the first and second monomers.

17. A lithographic photoresist composition comprising the copolymer of claim 1 and a radiation-sensitive acid generator.

18. The copolymer of claim 1, wherein $R^1$ is H, F, CN, $CH_3$, $CF_3$, $CF_2H$, or $CFH_2$.

19. The copolymer of claim 18, wherein $R^1$ is $CF_3$.

20. The copolymer of claim 19, wherein $R^3$ is COOR.

21. The copolymer of claim 20, wherein R is $C_{1-12}$ alkyl.

22. The copolymer of claim 20, wherein R is selected to render $R^3$ acid-cleavable.

23. The copolymer of claim 19, wherein $R^3$ is CN.

24. The copolymer of claim 18, wherein at least one of $R^1$, $R^3$, $R^4$, $R^5$, $R^6$, or $R^7$ is further substituted with an inert nonhydrogen substituent.

25. The copolymer of claim 24, wherein the inert nonhydrogen substituent is selected from the group consisting of F, $C_{1-12}$ alkyl, $C_{1-12}$ alkoxy, $C_{1-12}$ alkenyl, $C_{1-12}$ alkenyloxy, $C_{1-12}$ fluoroalkyl, $C_{1-12}$ fluoroalkoxy, and $C_{1-12}$ fluoroalkenyl.

26. A process for generating a resist image on a substrate, comprising the steps of:
   (a) coating a substrate with a film of a photoresist comprised of a radiation-sensitive acid generator and a copolymer synthesized from a first monomer having the structure of formula (I)

wherein
   $R^1$ is H, F, CN, $CH_3$, or $C_{1-6}$ fluoroalkyl,
   $R^{2a}$ and $R^{2b}$ are independently H or F, and
   $R^3$ is CN or COOR, wherein R is selected from the group consisting of H, $C_{1-12}$ alkyl and $C_{1-12}$ fluoroalkyl, or is selected so as to render $R^3$ acid-cleavable, with the proviso that when $R^3$ is CN, then $R^1$ is $CF_3$ and $R^{2a}$ and $R^{2b}$ are H; and
   a second monomer having the structure of formula (II)

wherein
   $R^4$ is H, $C_{1-12}$ alkyl, $C_{3-15}$ alicyclic or fluorinated $C_{3-15}$ alicyclic,
   $R^5$ is $C_{1-12}$ alkyl, $C_{1-12}$ alkyl substituted with 1-12 fluorine atoms and 0-2 hydroxyl groups, or $C_{3-15}$ alicyclic, or $R^4$ and $R^5$ together form a five-, six-, or seven-membered ring,
   $R^6$ is H, $C_{1-12}$ alkyl, or $C_{1-12}$ fluoroalkyl, or $R^4$ and $R^6$ together form a five-, six-, or seven-membered ring,
   $R^7$ is H, $C_{1-12}$ alkyl, or $C_{1-12}$ fluoroalkyl, or $R^7$ and $R^5$ together represent —X—$(CR^8R^9)_n$—, in which case $R^4$ and $R^6$ are H, X is O or $CH_2$, n is 1 or 2, $R^8$ and $R^9$ are H, $C_{1-12}$ alkyl, or $C_{1-12}$ fluoroalkyl, or together form an oxo moiety (=O), with the proviso that when $R^8$ and $R^9$ together form =O, n is 1,
   wherein any of $R^1$, $R^3$, $R^4$, $R^5$, $R^6$, and $R^7$ may be further substituted with an inert nonhydrogen substituent, and further wherein when $R^5$ is $C_{1-12}$ alkyl, at least one of $R^4$, $R^6$ and $R^7$ is other than hydrogen;
   (b) exposing the film selectively to a predetermined pattern of radiation so as to form a latent, patterned image in the film; and
   (c) developing the latent image with a developer.

27. In a lithographic photoresist composition comprised of a polymer transparent to deep ultraviolet radiation and a radiation-sensitive acid generator, the improvement comprising employing as the polymer a copolymer synthesized from a first monomer having the structure of formula (I)

wherein
   $R^1$ is H, F, CN, $CH_3$, or $C_{1-6}$ fluoroalkyl,
   $R^{2a}$ and $R^{2b}$ are independently H or F, and,
   $R^3$ is CN or COOR, wherein R is selected from the group consisting of H, $C_{1-12}$ alkyl and $C_{1-12}$ fluoroalkyl, or is selected so as to render $R^3$ acid-cleavable, with the proviso that when $R^3$ is CN, then $R^1$ is $CF_3$ and $R^2$ is H, and
   a second monomer having the structure of formula (II)

wherein
   $R^4$ is H, $C_{1-12}$ alkyl, $C_{3-15}$ alicyclic, or fluorinated $C_{3-15}$ alicyclic,
   $R^5$ is $C_{1-12}$ alkyl, $C_{1-12}$ alkyl substituted with 1-12 fluorine atoms and 0-2 hydroxyl groups, or $C_{3-15}$ alicyclic, or $R^4$ and $R^5$ together form a five-, six-, or seven-membered ring,
   $R^6$ is H, $C_{1-12}$ alkyl, or $C_{1-12}$ fluoroalkyl, or $R^4$ and $R^6$ together form a five-, six-, or seven-membered ring;
   $R^7$ is H, $C_{1-12}$ alkyl, or $C_{1-12}$ fluoroalkyl, or $R^7$ and $R^5$ together represent —X—$(CR^8R^9)_n$—, in which case $R^4$ and $R^6$ are H, X is O or $CH_2$, n is 1 or 2, $R^8$ and $R^9$ are H, $C_{1-12}$ alkyl, or $C_{1-12}$ fluoroalkyl, or together form an oxo moiety (=O), with the proviso that when $R^8$ and $R^9$ together form =O, n is 1,
   wherein any of $R^1$, $R^3$, $R^4$, $R^5$, $R^6$, and $R^7$ may be further substituted with an inert nonhydrogen substituent, and further wherein when $R^5$ is $C_{1-12}$ alkyl, at least one of $R^4$, $R^6$ and $R^7$ is other than hydrogen.

28. The lithographic photoresist composition of claim 27, wherein the photoresist composition is a positive resist and further comprises a photoacid-cleavable monomeric or polymeric dissolution inhibitor.

29. The lithographic photoresist composition of claim 27, wherein the photoresist composition is a negative resist and further comprises a crosslinking agent.

30. The lithographic photoresist composition of claim 29, wherein the crosslinking agent is a glycoluril compound.

31. The lithographic photoresist composition of claim 30, wherein the glycoluril compound is selected from the group consisting of tetramethoxymethyl glycoluril, methylpropyltetramethoxymethyl glycoluril, methylphenyltetramethoxymethyl glycoluril, and mixtures thereof.

* * * * *

UNITED STATES PATENT AND TRADEMARK OFFICE
CERTIFICATE OF CORRECTION

| | | |
|---|---|---|
| PATENT NO. | : 7,358,027 B2 | Page 1 of 1 |
| APPLICATION NO. | : 10/091373 | |
| DATED | : April 15, 2008 | |
| INVENTOR(S) | : Hiroshi Ito | |

It is certified that error appears in the above-identified patent and that said Letters Patent is hereby corrected as shown below:

In Claim 27, Col. 22, line 14, please delete "and," and replace with --and--.

In Claim 27, Col. 22, line 44, please delete "$^{are\ H,\ C}$" and replace with --are H, C--.

Signed and Sealed this

Fourteenth Day of September, 2010

David J. Kappos
*Director of the United States Patent and Trademark Office*